US00RE49458E

(19) United States
(12) Reissued Patent
Park et al.

(10) Patent Number: US RE49,458 E
(45) Date of Reissued Patent: Mar. 14, 2023

(54) BACKLIGHT ASSEMBLY AND DISPLAY DEVICE INCLUDING THE SAME

(71) Applicant: SAMSUNG DISPLAY CO., LTD., Yongin (KR)

(72) Inventors: Hyun-Su Park, Suwon-si (KR); Jae-Sang Lee, Cheonan-si (KR); Sang-Hyeok Lee, Asan-si (KR); Ki-Hwan Baek, Asan-si (KR)

(73) Assignee: SAMSUNG DISPLAY CO., LTD., Gyeonggi-Do (KR)

(21) Appl. No.: 15/821,856

(22) Filed: Nov. 24, 2017

Related U.S. Patent Documents

Reissue of:
(64) Patent No.: 9,194,571
Issued: Nov. 24, 2015
Appl. No.: 13/910,596
Filed: Jun. 5, 2013

U.S. Applications:
(63) Continuation of application No. 12/696,948, filed on Jan. 29, 2010, now abandoned.

(30) Foreign Application Priority Data

Jan. 29, 2009 (KR) ..... 10-2009-0007034

(51) Int. Cl.
*G02F 1/1335* (2006.01)
*F21V 29/00* (2015.01)
(Continued)

(52) U.S. Cl.
CPC ..... *G02B 6/0085* (2013.01); *G02B 6/0073* (2013.01); *G02F 1/133308* (2013.01); *G02F 1/133615* (2013.01)

(58) Field of Classification Search
CPC .. G02B 6/0068; G02B 6/0073; G02B 6/0083; G02B 6/0085; G02B 6/0091;
(Continued)

(56) References Cited

U.S. PATENT DOCUMENTS 7,270,464 B2 * 9/2007 Nakayoshi ..... G02B 6/0021 362/612
7,440,046 B2 * 10/2008 Kang ..... G02B 6/0031 349/56
(Continued)

FOREIGN PATENT DOCUMENTS

CN 1459651 A 12/2003
CN 1881040 A 12/2006
(Continued)

OTHER PUBLICATIONS

Chinese Office Action-CN Application No. 201010104657.4 dated Dec. 24, 2013 by SIPO.
(Continued)

*Primary Examiner* — Henry N Tran
(74) *Attorney, Agent, or Firm* — Cantor Colburn LLP

(57) ABSTRACT

A backlight assembly and a display device including the backlight assembly include a light source which emits light, a light guide plate disposed adjacent to the light source and which receives the light emitted from the light source, a light source supporter including a bottom plane including a first region and a second region, and a first receiving unit including a bottom surface and a side wall. The light source and the light guide plate are disposed on the first region of the bottom plane, the second region extends from a portion of the first region on which the light source is disposed, the bottom surface is disposed opposite the light guide plate, and the side wall is disposed at an end portion of the bottom surface along a direction perpendicular to a plane defined by the bottom surface.

19 Claims, 5 Drawing Sheets

(51) Int. Cl.
*F21V 8/00* (2006.01)
*G02F 1/1333* (2006.01)
*G02F 1/13357* (2006.01)

(58) Field of Classification Search
CPC ..... H05K 7/20963; G02F 1/133308; G02F 1/133615; G02F 2001/133317; G02F 2001/133628
USPC ..... 349/62, 65
See application file for complete search history.

(56) References Cited

U.S. PATENT DOCUMENTS

| | | | | |
|---|---|---|---|---|
| 7,771,104 | B2 | 8/2010 | Iwasaki | |
| 7,864,258 | B2 * | 1/2011 | Cho | G02B 6/0073 349/58 |
| 2001/0050732 | A1 * | 12/2001 | Okamoto et al. | G02F 1/133308 349/58 |
| 2003/0218702 | A1 | 11/2003 | Kwon et al. | |
| 2006/0203140 | A1 | 9/2006 | Kim | |
| 2006/0239035 | A1 | 10/2006 | Won et al. | |
| 2006/0243948 | A1 | 11/2006 | Ishiwa et al. | |
| 2006/0285362 | A1 | 12/2006 | Cho et al. | |
| 2007/0085943 | A1 * | 4/2007 | Kang et al. | 349/65 |
| 2007/0133222 | A1 | 6/2007 | Watanabe et al. | |
| 2008/0304286 | A1 | 12/2008 | Iwasaki | |
| 2008/0304288 | A1 | 12/2008 | Iwasaki | |
| 2011/0273631 | A1 * | 11/2011 | Hayashi | G02B 6/0091 348/790 |

FOREIGN PATENT DOCUMENTS

| | | | |
|---|---|---|---|
| CN | 1912711 | A | 2/2007 |
| CN | 1949055 | A | 4/2007 |
| CN | 101017278 | | 8/2007 |
| CN | 101017278 | A | 8/2007 |
| CN | 101038389 | A | 9/2007 |
| CN | 101149534 | A | 3/2008 |
| CN | 101308272 | A | 11/2008 |
| EP | 1835330 | A1 | 9/2007 |
| JP | 2004117744 | A | 4/2004 |
| JP | 2005077979 | A | 3/2005 |
| JP | 2005528748 | | 9/2005 |
| JP | 2005528748 | A | 9/2005 |
| JP | WO 2006080201 | A1 * | 3/2006 |
| JP | 2007287463 | A | 11/2007 |
| JP | 2008066008 | | 3/2008 |
| JP | 2008216406 | A | 9/2008 |
| JP | 2008299181 | | 12/2008 |
| JP | 2008299181 | A | 12/2008 |
| JP | 2008305657 | A | 12/2008 |
| JP | 2008305713 | | 12/2008 |
| JP | 2008305713 | A | 12/2008 |
| KR | 1020060131382 | A | 12/2006 |
| KR | 1020070076879 | A | 7/2007 |
| KR | 1020070093216 | A | 9/2007 |
| TW | 200600915 | | 1/2006 |
| TW | 200600915 | A | 1/2006 |
| TW | 200609606 | | 3/2006 |
| TW | 200609606 | A | 3/2006 |
| TW | 200813564 | | 3/2008 |
| TW | 200813564 | A | 3/2008 |
| TW | 200831996 | | 8/2008 |
| TW | 200831996 | A | 8/2008 |
| TW | 200842452 | | 11/2008 |
| TW | 200842452 | A | 11/2008 |
| WO | 03102680 | | 12/2003 |
| WO | 03102680 | A1 | 12/2003 |
| WO | 2006080201 | A1 | 8/2006 |

OTHER PUBLICATIONS

Japanese Office Action-Japanese patent application No. 2014-145908 dated Apr. 7, 2015.
Korean Office Action-KR Application No. 10-2009-0007034 dated Dec. 15, 2014, citing KR 2007-0093216A and JP 2005-077979A.
Taiwanese Office Action-Taiwanese patent application No. 099102439 dated Mar. 24, 2015.
Machine translation of Lee, Sang Yu et al (KR 10-2006-0131382), Dec. 12, 2006.*
Machine translation of KR 10-2007-00193216, Sep. 18, 2007.*
European Search Report for application No. 10000501.6-2205 dated Jun. 2, 2010.

* cited by examiner

BACKLIGHT ASSEMBLY AND DISPLAY DEVICE INCLUDING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This application is a reissue application of U.S. Pat. No. 9,194,571, issued on Nov. 24, 2015.* This application is a continuation of U.S. patent application Ser. No. 12/696,948, filed on Jan. 29, 2010, which claims priority to Korean Patent Application No. 2009-0007034, filed on Jan. 29, 2009, and all the benefits accruing therefrom under 35 U.S.C. §119, the content of which in its entirety is herein incorporated by reference.

BACKGROUND OF THE INVENTION (1) Field of the Invention

The present invention relates to a backlight assembly and a display device including the backlight assembly. More particularly, the present invention relates to a backlight assembly that effectively discharges heat generated from a light source therein, and a display device having the backlight assembly.

(2) Description of the Related Art

In general, liquid crystal display devices are often used due to a variety of features, such as light weight, slim shape, low power consumption, full-color implementation and high resolution, for example. Specifically, for example, liquid crystal display devices are utilized in computers, laptop computers, portable digital assistants ("PDAs"), telephones, television ("TV") sets, audio/video devices and other similar devices. In liquid crystal display devices, light transmission is controlled, based on image signals applied to control switches disposed in a matrix pattern, to display images on liquid crystal display panels of the devices.

However, a liquid crystal display device is not a self light-emitting device, and thus, requires a light source such as a backlight, for example. The backlight for the liquid crystal display device may be an edge type backlight or a direct type backlight, based on a position of the light source in the backlight.

More specifically, in the edge type backlight, for example, the light source is disposed at an end portion of the liquid crystal display panel, such that light emitted from the light source is radiated to the liquid crystal display panel through a transparent waveguide plate disposed below the liquid crystal display panel. The edge type backlight provides good light uniformity, has a substantially extended life span and can easily be included in a thin display device. In general, the edge type backlight is employed in a medium-size or small-size liquid crystal display panel.

On the other hand, in the direct type backlight, light sources are typically disposed below the liquid crystal display panel such that light emitted from the light source is radiated over an entire surface of the liquid crystal display panel. The direct type backlight provides high luminance and can generally be employed in a large-size or medium-size liquid crystal display panel.

In a conventional backlight, a cold cathode fluorescent lamp may be used as a light source. Recently, research has been conducted into using a light emitting diode as the light source, since the light emitting diode has various properties such as long life span, lower power consumption, light weight and thin shape, for example. However, the light emitting diode generates a substantial amount of heat. Therefore, a reliability of electric circuits is degraded, due to an increase in the internal temperature of a backlight assembly caused by heat generated from the light emitting diode. In addition, deformation of parts or cases is caused due to thermal stresses caused by an internal temperature gradient.

BRIEF SUMMARY OF THE INVENTION

An aspect of the present invention relates to a display device including a light source which emits light, a light guide plate disposed adjacent to the light source and which receives the light emitted from the light source, a light source supporter including a bottom plane including a first region and a second region, and a first receiving unit including a bottom surface and a side wall. In an exemplary embodiment, the light source and the light guide plate are disposed on the first region of the bottom plane, the second region extends from a portion of the first region on which the light source is disposed, the bottom surface is disposed opposite the light guide plate, and the side wall is disposed at an end portion of the bottom surface along a direction perpendicular to a plane defined by the bottom surface.

In an exemplary embodiment, the light source may include a printed circuit board and a light emitting diode.

In an exemplary embodiment, an inner space may be formed on the second region and between the light source and the side wall of the first receiving unit.

In an exemplary embodiment, the light source supporter may further include a bent portion disposed on an end portion of the second region of the light source supporter.

In an exemplary embodiment, the backlight assembly may further include a middle frame and at least a portion of the middle frame may be disposed in the inner space.

In an exemplary embodiment, the middle frame may include a U-shaped portion, and at least a portion of the U-shaped portion of the middle frame may be disposed in the inner space.

In an exemplary embodiment, the middle frame may further include a bent portion connected to the U-shaped portion and disposed on an optical sheet disposed on the light source and the light guide plate.

In an exemplary embodiment, the light source supporter may include a metal plate.

In another exemplary embodiment, the light source supporter may include aluminum.

In an exemplary embodiment, the second region of the light source supporter may extend from the light source and provide a heat dissipation path for the backlight assembly.

In an exemplary embodiment, the light source supporter may contact the first receiving unit and dissipate heat.

In an exemplary embodiment, the bent portion of the second region may be disposed along the side wall of the first receiving unit and contact the side wall.

In an exemplary embodiment, a hole may be formed in the bottom surface of the first receiving unit, and the light source supporter may further include a protrusion disposed in the hole.

In another exemplary embodiment, a liquid crystal display includes a liquid crystal panel, a backlight assembly and a second receiving unit. The liquid displays an image. The backlight assembly includes a light source disposed adjacent to an edge portion of the liquid crystal panel, a light guide plate disposed adjacent to the light source and which emits light to the liquid crystal panel, an optical sheet disposed between the light guide plate and the liquid crystal panel, a first receiving unit including a bottom surface and a side wall and which accommodates the light source, the light guide plate and the optical sheet and a light source supporter which supports the light source and the light guide plate, the light source and the light guide disposed on a first region of the light source supporter. The second receiving unit covers at least a portion of the edge portion of the liquid crystal panel and the side wall of the first receiving unit.

In an exemplary embodiment, the light source supporter may include a second region extending from the first region of the light source supporter.

In an exemplary embodiment, a gap may be formed on the second region of the light source supporter and between an end portion of the second region and the light source.

In an exemplary embodiment, the liquid crystal display may further include a third receiving unit covering at least a portion of the optical sheet and the liquid crystal panel, and at least a portion of the third receiving unit may be disposed in the gap.

In an exemplary embodiment, the third receiving unit may include a U-shaped portion disposed in the gap.

In an exemplary embodiment, the light source supporter may include metallic material.

In another exemplary embodiment, the light source supporter may include aluminum.

BRIEF DESCRIPTION OF THE DRAWINGS

The above and other aspects and features of the present invention will become more readily apparent by describing in further detail embodiments thereof with reference to the accompanying drawings, in which.

DETAILED DESCRIPTION OF THE INVENTION

Figure 1:
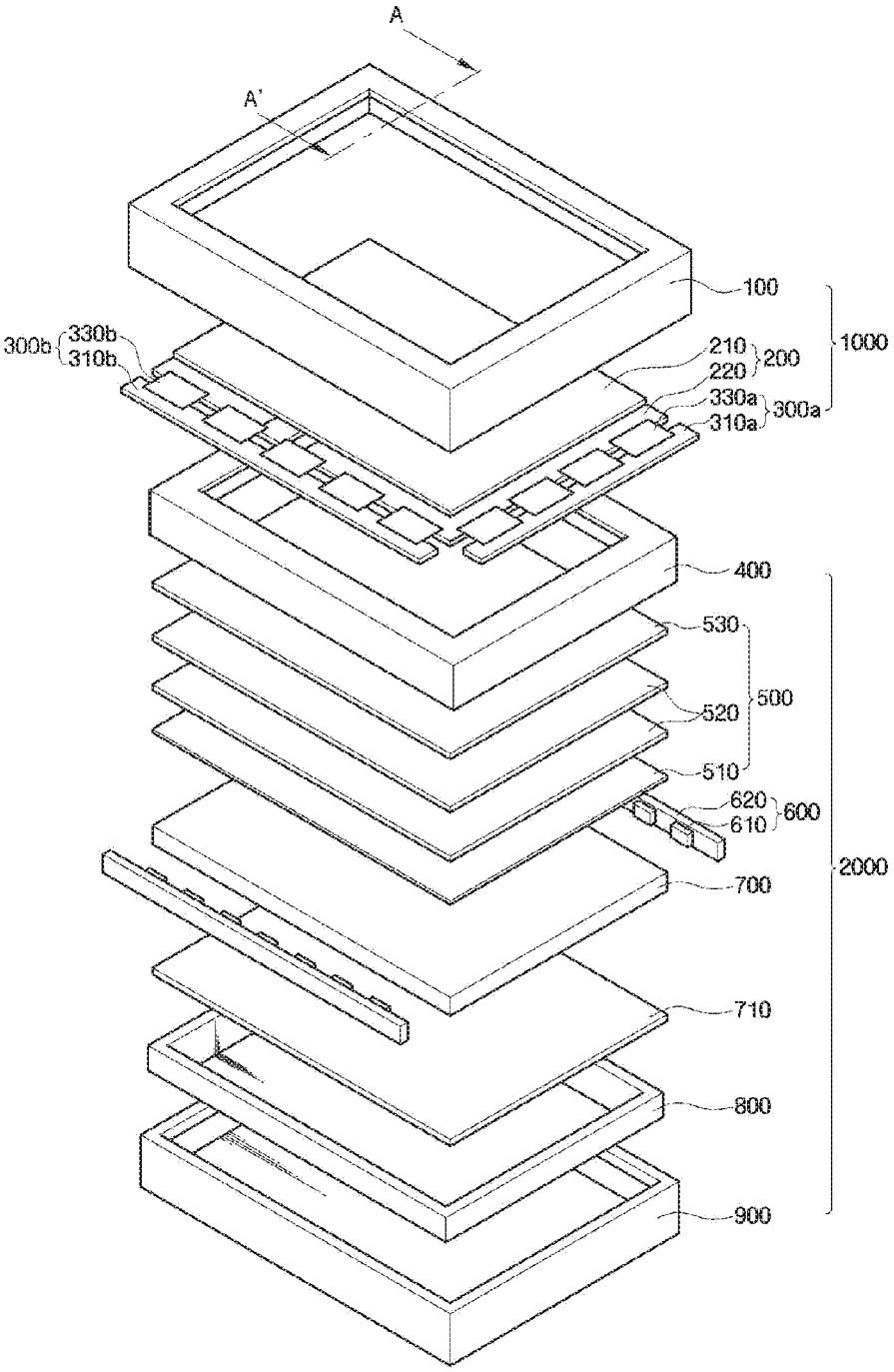
FIG. 1 is an exploded perspective view of an exemplary embodiment of a display device according to the present invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

One or more embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, one or more exemplary embodiments of the present invention will be described in further detail with reference to the accompanying drawings.

Figure 2:
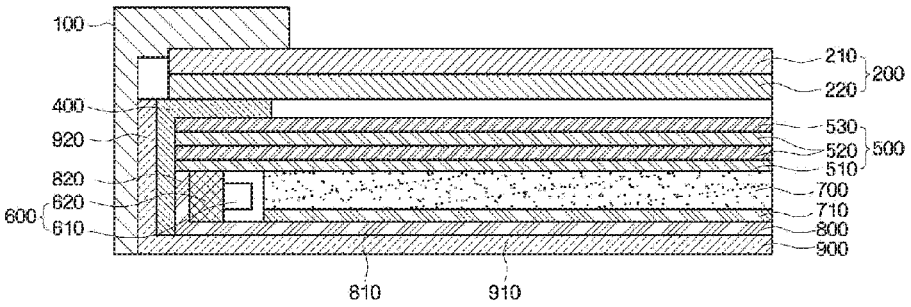
FIG. 2 is a partial cross-sectional view taken along line A-A' of FIG. 1.

FIG. 1 is an exploded perspective view of an exemplary embodiment of a display device according to the present invention. FIG. 2 is a partial cross-sectional view taken along line A-A' of FIG. 1.

Referring to FIGS. 1 and 2, a liquid crystal display ("LCD") device includes a display assembly 1000 disposed in an upper portion of the LCD device and a backlight assembly 2000 disposed in a lower portion of the LCD device.

The display assembly 1000 includes a liquid crystal ("LC") panel 200, a driver circuit 300 including a first driver circuit 300a and a second driver circuit 300b, and a second receiving unit 100.

The LC panel 200 includes a color filter substrate 210 and a thin film transistor ("TFT") substrate 220. The color filter substrate 210 includes red, green and blue ("RGB") pixels, which are disposed using a thin film process and generate a predetermined color when light passes through the RGB pixels. A common electrode, including a transparent conductive material such as indium thin oxide ("ITO") or indium zinc oxide ("IZO"), for example, is disposed on an outer surface of the color filter substrate 210.

The TFT substrate 220 is a transparent glass substrate on which thin film transistors are disposed in a matrix pattern. A source terminal of each of the TFTs is connected to a data line, and a gate terminal of the each of the TFTs is connected to a gate line. In addition, a drain terminal of each of the TFTs is connected to a pixel electrode, which is a transparent electrode including a transparent conductive material. When an electrical signal is applied to the data line and gate line, each of the TFTs is turned on or off to apply an electrical signal to drive a pixel connected to the drain terminal. Specifically, when electric power is applied to the gate terminal and source terminal of the TFT substrate 220 to turn the TFT on, an electric field is generated between the pixel electrode and the common electrode of the color filter substrate 210. Thus, liquid crystal molecules in the LC panel disposed between the TFT substrate 220 and the color filter substrate 210 changes their orientation and light transmissivity is changed according to the change of the orientation, thereby displaying a desired image.

The driver circuit 300 connected to the LC panel 200 includes a data-side printed circuit board ("PCB") 310a, which may include a control integrated circuit ("IC") and apply a predetermined data signal to the data line of the TFT substrate 220, a gate-side printed circuit board 310b which may include a control integrated circuit and apply a gate signal to the gate line of the TFT substrate 220, a data-side flexible printed circuit board ("FPCB") 330a which has an exposed ground pattern and connects the TFT substrate 220 to the data-side printed circuit board 310a, and a gate-side flexible printed circuit board 330b which has an exposed ground pattern and connects the TFT substrate 220 to the gate-side printed circuit board 310b.

The data-side and gate-side printed circuit boards 310a and 310b are connected to the data-side and gate-side flexible printed circuit boards 330a and 330b , respectively, and thereby transmit an external image signal and a gate drive signal. The data-side and gate-side printed circuit boards 310a and 310b may be disposed on a same printed circuit board. In an exemplary embodiment, the data-side and gate-side printed circuit boards 310a and 310b may be alternately connected to a side of the LC panel 200 and the gate line and data line of the TFT substrate 220 may extend to one side thereof.

The data-side and gate-side flexible printed circuit boards 330a and 330b are connected to the data line and to the gate line of the TFT substrate 220, respectively, and thereby transmit a data drive signal and a gate drive signal to the TFT. In an exemplary embodiment, the flexible printed circuit board 230 include a tape automated bonding ("TAB") integrated circuit, which alternately transmits read, green, blue signals, a shift start clock ("SSC") signal, a latch pulse ("LP") signal, a gamma analog ground signal, a digital ground signal, digital electric power, an analog electric power common voltage, a stored voltage and other similar signals, for example, which are generated from the data-side and gate-side printed circuit boards 310a and 310b, to the LC panel 200. In an exemplary embodiment, the TFT substrate 220 may include an integrated circuit.

The second receiving unit 100 is in a rectangular frame shape having a plane section and a sidewall section disposed perpendicular to the plane section. The second receiving unit effectively prevents components of the display assembly 1000 from departing from the display assemble 1000 and protects LC panel 200 and backlight assembly 2000 against external impact. In an exemplary embodiment, the second receiving unit 100 may cover at least a portion of the LC panel 200 and the backlight assembly 2000.

In an exemplary embodiment, the backlight assembly 2000 includes a light source 600, a light guide plate 700 disposed adjacent to the light source 600, a reflective sheet 710 disposed below the light guide plate 700, optical sheets 500 disposed above the light guide plate 700 and a first receiving unit 900 accommodating the reflective sheet 710, the light guide plate 700 and the optical sheets 500. The backlight assembly 2000 may further include a third receiving unit 400 accommodating the reflective sheet 710, light guide plate 700 and optical sheets 500 along with the first receiving unit 900. The third receiving unit 400 may be referred to as a middle frame 400, which is disposed between the first and second receiving units 900 and 100. The third receiving unit 400 may include plastic material.

As shown in FIGS. 1 and 2, a metal plate 800 attached to the light source 600 to dissipate heat is further included in the backlight assembly. In one or more exemplary embodiments, the metal plate 800 is referred to as a light source supporter 800, and the light source supporter 800 is disposed adjacent to, e.g., is attached to, the light source 600. Hereinafter, the metal plate may be referred to as the light source supporter when the light source supporter accommodates and supports the light source.

In an exemplary embodiment, the light source 600 includes a printed circuit board 620 and a light emitting diode 610 disposed thereon. The light emitting diode 610 emits white light or one color of the red, green and blue. The backlight assembly may include more than one light emitting diode 610.

The printed circuit board 620 may discharge heat generated from the light emitting diode 610 to an outside and supply a predetermined voltage to the light emitting diode 610 disposed on the printed circuit board 620. The printed circuit board may include a metallic layer such as metal core printed circuit board ("MCPCB"), for example.

In an exemplary embodiment, a groove may be formed in a predetermined portion of the printed circuit board 620, and the light emitting diode may be disposed on the groove such that the printed circuit board 620 surrounds the light emitting diode 610 and thereby provides a reflective surface to the light emitting diode 610 and maximizes light efficiency. The printed circuit board 620 may include at least one light emitting diode 610.

In FIG. 2, light source 600 is disposed in a side of the backlight. In another embodiment, the light source 600 may be disposed in more than one side of the backlight assembly according to types of the display devices such as cellular phone, monitor, a laptop computer and television set, for example.

The light guide plate 700 is disposed in the first receiving unit 900 and disposed opposite, e.g., facing, the light sources 600 to convert light distribution of a line light source generated from light sources 600 into a light distribution of a surface light source. In an exemplary embodiment, the light guide plate 700 may include a wedge-type plate or parallel flat plate, for example. In addition, the light guide plate 700 may include polymethyl methacrylate ("PMMA"), which has good transmissivity and high strength, and thereby effectively prevents deformation or damage. The light guide plate 700 may be disposed apart from the light source at a predetermined distance or disposed adjacent to the light source 600.

The reflective sheet 710 includes a plate with high light reflectivity such that light incident thereon through a rear surface of the light guide plate 700 is reflected again to the light guide plate 700, thereby reducing light loss. The reflective sheet 710 may be disposed below the first receiving unit 900. Although it has been illustrated in the figures that the reflective sheet 710 is in a flat shape, the reflective plate may be in various shapes, for example, a corrugated form having a triangular projection protruding from a reference reflective surface. Further, when a highly reflective material is disposed at a bottom surface of the first receiving unit 900, the reflective sheet 710 may be omitted or integrated into the first receiving unit 900.

The optical sheets 500 include a diffusion sheet 510, a polarization sheet 520 and a luminance-improving sheet 530, which are disposed above the light guide plate 700 to cause a luminance distribution of the light emitted from the light guide plate 700 to be uniform. The diffusion sheet 510 may direct the light incident from the lower light guide plate towards a surface of the LC panel 200 to be diffused and uniformly distributed in a wide range such that a diffused light is radiated on the LC panel 200. The diffusion sheet 510 includes a transparent resin film including a light diffusion member disposed on at least one side of the diffusion sheet 510. The polarization sheet 520 converts light incident thereon at an inclined angle into light emitted vertically from the polarization sheet 520 and incident perpendicular to the LC panel 200, and the light efficiency is thereby substantially maximized. Therefore, at least one polarization sheet 520 may be disposed below the LC panel 200 such that the light is emitted from the polarization sheet 520 to be perpendicular to the LC panel 200. In an exemplary embodiment, two polarization sheets may be used, which include a first polarization sheet which polarizes the light from the diffusion sheet in a first direction and a second polarization sheet which polarizes the light in a second direction perpendicular to a plane defined by the first polarization sheet. The luminance-improving sheet 530 transmits light parallel to a transmission axis of the luminance-improving sheet and reflects light perpendicular to the transmission axis. In an exemplary embodiment, the transmission axis of the luminance-improving sheet 530 may be in a same direction as the polarization axis of the polarization sheet 520, and transmission efficiency is thereby substantially increased.

The first receiving unit 900 may be in a box-like shape including open top and predetermined depth to have a receiving space. The first receiving unit 900 includes bottom surface 910 and side walls 920 extended vertically from the bottom surface 910. At an inner space of the opposing side walls 920, disposed opposite to, e.g., facing, each other a metal plate 800 is disposed in the first receiving unit 900. Thus, the metal plate 800 is disposed in a gap between the bottom surface 910 of the first receiving unit 900 and the light source 600.

The metal plate 800 includes a bottom plane 810 and a lateral plane 820 extended vertically from the bottom plane 810. (As described above, the metal plate 800 is also referred to as "light source supporter" which supports the light source.) In an exemplary embodiment, the lateral plane 820 contacts the third receiving unit 400, i.e. middle mold structure, and the bottom plane 810 contacts the first receiving unit 900. With the contacting structure of the metal plate 800, heat generated from the light source 600 migrates to the metal plate 800 and thereby spread to the first and third receiving unit 900 and 400. The heat spread to the first and third receiving unit is further dissipated to the outside of the LCD and thereby substantially lower the temperature of the LCD.

The metal plate 800 may include any material with sufficient thermal conductivity such as aluminum, stainless steel and iron, for example, to transfer heat from the metal plate 800 to outside of the LCD. The metal plate 800 may be formed using various methods such as assembling or welding the bottom plane 810 and the lateral plane 820, for example. In an exemplary embodiment, the whole shape of the metal plate 800 may be formed using molded metal material inserted and taken out from a predesigned frame.

Figure 3:
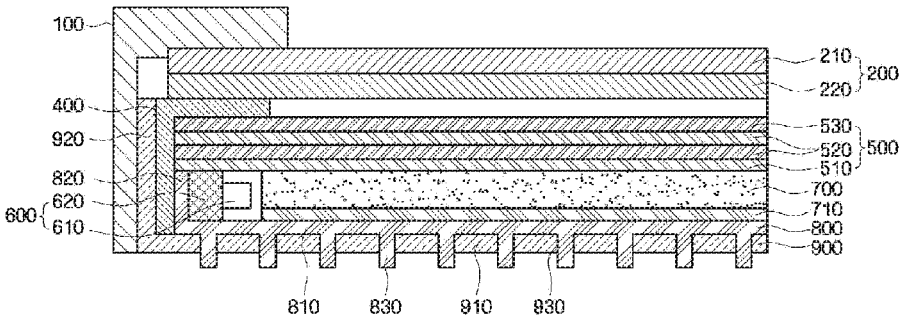
FIGS. 3 to 5 are partial cross-sectional views showing additional exemplary embodiments of a metal plate of the display device shown in FIG. 2.

FIG. 3 is a partial cross-sectional view of another exemplary embodiment of the metal plate 800 of the display device of FIG. 2.

As shown in FIG. 3, the first receiving unit 900 has at least one hole 930 on the bottom surface 910 accommodating at least one protrusion 830 extended from the metal plate 800. The protrusion 830 is exposed to the outside of LCD by passing through the hole 930 of the first receiving unit 900. Here, convection heat transfer, made by the contact structure of the first receiving unit 900 and the metal plate 800, is accommodated since the heat may be directly transferred to an outside atmosphere.

Referring to FIGS. 1 to 3, a route of heat dissipation will now be described. In an exemplary embodiment, heat generated from the light source 600 is transferred metal plate 800 contacting the light source 600, and the heat transferred from the light source 600 is further transferred to lateral plane 820 contacting third receiving unit 400 and bottom plane 810 contacting the bottom surface 910 of the first receiving unit 900. The heat transferred to the third receiving unit 400 may be transferred to the first receiving unit 900 through inter-contact structure. In an exemplary embodiment, heat, emitted along with light from the LED 610 of the light source 600, is transferred to the printed circuit board ("PCB") 620 where the LED 610 is disposed, and the heat is dissipated to the outside through inter-contact structures of the metal plate 800, the first receiving unit 900, and the third receiving unit 400.

The third receiving unit 400 covers at least a portion of the optical sheets 500 along with the first receiving unit 900. The third receiving unit may include plastic material according to contact structure of the optical sheets and light backlight assembly. As described above, the third receiving unit is also referred to as "a middle mold frame." In another embodiment, the third receiving unit 400 may be omitted corresponding to application of the LCD. For example, an exemplary embodiment of the LCD in a small sized application may not include the third receiving unit 400 for a simple structure.

Figure 4:
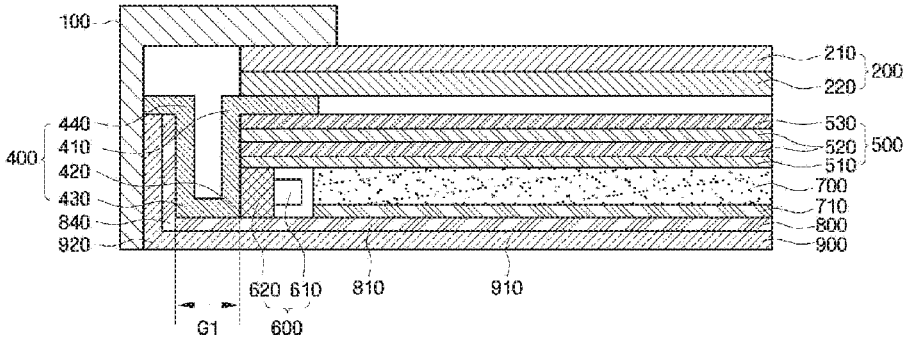
Figure 5:
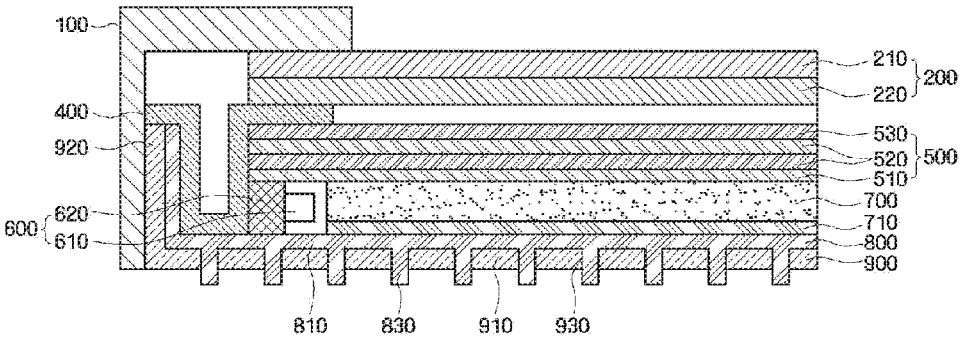

FIGS. 4 and 5 are partial cross-sectional views showing additional exemplary embodiments of the metal plate 800.

As shown in FIGS. 4 and 5, the metal plate 800 may include a bent portion 840 connected to an elongated end of the bottom plane 810 and extending substantially perpendicular to the bottom plane 810 from an edge portion of the bottom plane 810 of the metal plate 800 along the side wall 920 of the first receiving unit 900. The metal plate including the bent portion 840 effectively discharges the heat from the light source.

As shown in FIG. 4, the metal plate 800 supports the light guide plate 700 with the bottom plane 810 similarly to the metal plates shown in FIGS. 1 to 3. The metal plate 800 further supports the light source, e.g., light emitting diode 610, which is disposed above the metal plate 800. Hereinafter, a portion of the bottom plane 810 where the light source 600 and the light guide plate 700 are disposed on is referred to as "a first region."

The bottom plane 810 further extends to the side wall 920 of the first receiving unit 900. A portion of the bottom plane 810 where the third receiving unit 400 is disposed is referred to as "a second region" of the bottom surface 910. In another embodiment, the metal plate 800 may not include the bent portion 840. When the metal plate 800 includes the bent portion 840, a gap G1 may be formed between the bent portion 840 and the light source 600 as shown in FIG. 4. In another embodiment, the metal plate 800 may include the lateral plane shown in FIG. 2, and the gap G1 may be formed between the lateral plane and the bent portion 840 of the metal plate 800. In an exemplary embodiment, an area accommodated in discharging the heat of the light source 600 to the first receiving unit 900 may be substantially increased due to the gap G1, and temperature of the backlight assembly is thereby substantially lowered.

The third receiving unit may be disposed in the gap G1 as shown in FIG. 4. In an exemplary embodiment, the third receiving unit 400 may include a first portion, a second portion, a third portion, a fourth portion, a fifth portion, a first bending portion 410, a second bending portion 420, a third bending portion 430 and a fourth bending portion 440 and be bent four times and disposed in the gap G1. The first bending portion 410 connects the first portion and the second portion, the second bending portion 420 connects the second portion and the third portion, the third bending portion 430 connects the third portion and the fourth portion and the fourth bending portion 440 connects the fourth portion and the fifth portion. In an exemplary embodiment, the third receiving unit may include a U-shaped portion, e.g., the second portion, the third portion, fourth portion, the second bending portion 420 and the third bending portion 430 connected one another, and the first portion and the fifth portion are connected to the U-shaped portion. The first portion, which is a bent portion in an exemplary embodiment, is disposed between the optical sheets 500 and LC panel 200. In an exemplary embodiment, the first portion, the second portion, the first bending portion 410 and the second bending portion 420 of the third receiving unit 400 may cover at least a portion of the optical sheets 500, the light source 600 and the light guide plate 700 along with the first receiving unit 900 and thereby restrict movement of the optical sheets 500, the light source 600 and the light guide plate 700. In another embodiment, the second receiving unit 100 may cover at least a portion of the LC panel 200 along with the first portion 410 of the third receiving unit 400.

The first bending portion 410 is connected to the second portion disposed adjacent to one of the light source 600 and the lateral plane 820 of FIG. 2 of the metal plate 800. The third portion is disposed on the second region of the bottom surface 910 and the fourth portion is disposed opposite the side wall 920 of the first receiving unit 900. The fifth portion connected to the fourth bending portion 440 is disposed on the bent portion 840 of the metal plate 800 and the side wall 920 of the first receiving unit 900. In an exemplary embodiment, the third receiving unit 400 includes a U-shaped portion disposed in a space between the side wall 920 of the first receiving unit 900 and light source 600 as shown in FIG. 4. In another embodiment, the U-shaped portion may be disposed in a space between the bent portion 840 of the metal plate 800 and lateral plane 820 of FIG. 2 of the metal plate 800. The U-shaped portion may extend in a horizontal direction, parallel to the bottom surface 910 of the first receiving unit 900.

The whole shape of the third receiving unit 400 may vary to be disposed in a gap between the lateral plane 820 and the side wall 920 as shown in FIG. 2 and thereby effectively prevent departing of the light source 600 and the LC panel 200 from the display device due to external impact along with the second receiving unit 100. As described above, the third receiving unit 400 may be disposed between the lateral plane 820 and the bent portion 840 of the metal plate 800 when the metal plate further includes the lateral plane 820 disposed between the third receiving unit 400 and the light source 600. In an exemplary embodiment, the third receiving unit may include plastic material, and be referred to as the middle mold frame.

Figure 6:
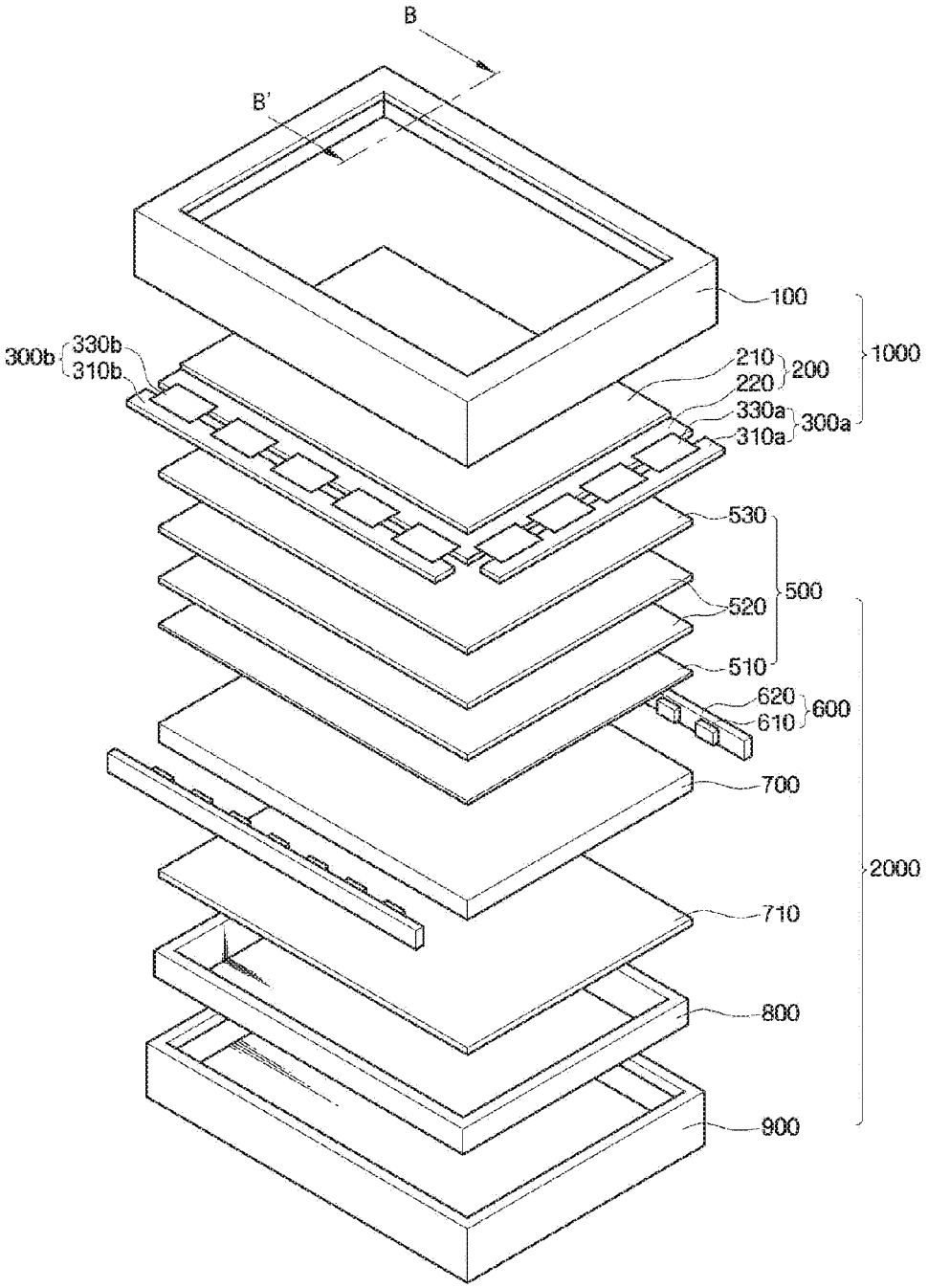
FIG. 6 is an exploded perspective view of another exemplary embodiment of a display device according to the present invention.
Figure 7:
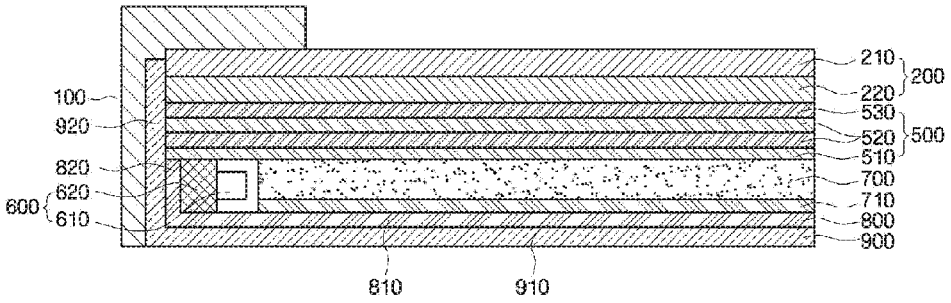
FIG. 7 is a partial cross-sectional view taken along line B-B' of FIG. 6.
Figure 8:
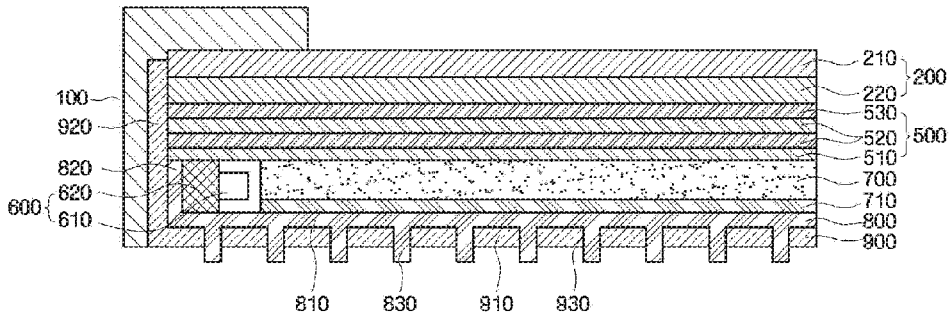
FIG. 8 is a partial cross-sectional view showing another exemplary embodiment of a metal plate of the display device shown in FIG. 7.

FIG. 5 is a partial cross-sectional view of still another exemplary embodiment of the metal plate 800 of the display panel shown in FIG. 2. The display device in FIG. 5 is substantially the same as the display device shown in FIG. 4 except that the first receiving unit 900 includes the hole 930 disposed in the bottom surface 910 and a protrusion 830 extending from the bottom plane 810 of the metal plate 800 through the hole 930, and thereby dissipates the heat of the metal plate 800 to the outside substantially effectively. The same or like elements shown in FIG. 5 have been labeled with the same reference characters as used above to describe the embodiment of display device shown in FIG. 4, and any repetitive detailed description thereof will hereinafter be omitted. One or more embodiments of the display device include a backlight assembly including the third receiving unit 400. However, the third receiving unit 400 may be omitted according to the overall design of the LCD. One or more embodiments of the LCD which do not include the third receiving unit 400 are shown in FIGS. 6 to 8. The same or like elements shown in FIGS. 6 to 8 have been labeled with the same reference characters as used above to describe the embodiments of the display device shown in FIGS. 1 to 5, and any repetitive detailed description thereof will hereinafter be omitted or simplified.

FIG. 6 is an exploded perspective view illustrating another exemplary embodiment of a display device according to the present invention. FIG. 7 is a partial cross-sectional view taken along line B-B' of FIG. 6. FIG. 8 is a partial cross-sectional view illustrating another exemplary embodiment of a metal plate of the display device shown in FIG. 7.

Referring to FIGS. 6 to 8, the embodiment of the display device includes a display assembly 1000 and a backlight assembly 2000. The display assembly 1000 includes a LC panel 200, driver circuits 300a and 300b and a second receiving unit 100. The LC panel 200 includes a color filter substrate and a TFT substrate. As shown in FIG. 6, the backlight assembly 2000 may include a light source 600, a light guide plate 700 disposed adjacent to the light source 600, a reflective sheet 710 disposed below the light guide plate 700, optical sheets 500 disposed above the light guide plate 700, a first receiving unit 900 accommodating the reflective sheet 710, the light guide plate 700 and the optical sheets 500, and a metal plate 800 which dissipates heat generated from the light source.

The light source 600 includes a printed circuit board 620 and a light emitting diode 610 disposed on the printed circuit board 620. The light emitting diode 610 emits white light or light having one color of the red, green and blue. The printed circuit board 620 may discharge heat generated from the light emitting diode 610 to outside and apply a predetermined voltage to the light emitting diode 610 disposed on the printed circuit board 620. In an exemplary embodiment, a groove may be formed in a predetermined portion of the printed circuit board 620, and the light emitting diode may be disposed in the groove such that the printed circuit board 620 surrounds at least a portion of the light emitting diode 610 and provides a reflective surface thereto, thereby maximizes light efficiency. In an exemplary embodiment, at least one light emitting diode 610 may be disposed on the printed circuit board 620.

As shown in FIGS. 6 and 7, the light source 600 may be disposed on side walls 920 of the first receiving unit 900 disposed opposite to, e.g., facing, each other. In another embodiment, the light source 600 may be disposed on one side wall 920 of the first receiving unit 900. In another embodiment, the light sources 600 may be disposed on four of the side walls 920 of the first receiving unit 900 and thereby surround the light guide plate 700. The number of light sources may vary based on a size and type of a device including the display device, for example, cellular phone, monitor, laptop computer and television set.

As shown in FIGS. 7 and 8, a lateral plane 820 of the metal plate 800 contacts the side wall 920 of the first receiving unit 900, and the bottom surface 910 of the first receiving unit 900 contacts the bottom plane 810 of the metal plate 800. By contacting side and bottom portions of the first receiving unit 900 and to side and bottom portions of the metal plate 800, the metal plate 800 transfers heat from the light source 600 to the first receiving unit 900.

The display device in FIG. 8 is substantially the same as the display device shown in FIG. 7 except that the first receiving unit 900 includes a hole 930 disposed in the bottom surface 910 and a protrusion 830 extending from the bottom plane 810 of the metal plate 800 through the hole 930, and thereby dissipates the heat of the metal plate 800 to the outside substantially effectively. The same or like elements shown in FIG. 8 have been labeled with the same reference characters as used above to describe the embodiment of display device shown in FIG. 7, and any repetitive detailed description thereof will hereinafter be omitted.

The present invention should not be construed as being limited to the embodiments set forth herein. Rather, these embodiments are provided so that this disclosure will be thorough and complete and will fully convey the concept of the present invention to those skilled in the art.

While the present invention has been particularly shown and described with reference to embodiments thereof, it will be understood by those of ordinary skill in the art that various changes in form and details may be made therein without departing from the spirit or scope of the present invention as defined by the following claims.

What is claimed is:

1. A backlight assembly comprising:

a light source which emits light*, wherein the light source comprises a printed circuit board and a light emitting diode*;

a light guide plate [disposed adjacent to the light source and] which receives the light emitted from the light source;

a light source supporter comprising a [bottom plane] *first supporting portion* and a [lateral plane] *second supporting portion* which is extended vertically from the [bottom plane] *first supporting portion* and integrated with the [bottom plane] *first supporting portion, the first supporting portion comprising a supporting surface, the second supporting portion comprising a first surface and a second surface opposing the first surface*; and a first receiving unit comprising a bottom [plane] *portion* and a lateral [plane] *portion* which is extended vertically from the bottom [plane] *portion* and integrated with the bottom [plane] *portion* and accommodating the light guide plate and the light source, wherein the light source and the light guide plate are disposed on the [bottom plane] *supporting surface of the first supporting portion* of the light source supporter, [and]

wherein the [lateral plane] *second surface of the second supporting portion* of the light source supporter is in direct contact with the lateral [plane] *portion* of the first receiving unit,

*wherein the first supporting portion of the light source supporter is disposed directly on the bottom portion of the first receiving unit, and*

*wherein a height of the second supporting portion of the light source supporter is less than or equal to a height of the lateral portion of the first receiving unit.*

2. The backlight assembly of claim 1, further comprising a middle frame, which is coupled to the first receiving unit, wherein at least a portion of the middle frame is in direct contact with the light source supporter.

3. The backlight assembly of claim 2, wherein the middle frame comprises a U-shaped portion, and at least a portion of the U-shaped portion of the middle frame is disposed in the inner space.

4. The backlight assembly of claim 3, wherein the middle frame further comprises a bent portion connected to the U-shaped portion and disposed on an optical sheet disposed on the light source and the light guide plate.

5. The backlight assembly of claim 1, wherein the light source supporter includes a metal plate.

6. The backlight assembly of claim 1, wherein a hole is formed in [a] *the* bottom [surface] *portion* of the first receiving unit, and the light source supporter further comprises a protrusion disposed in the hole.

7. The backlight assembly of claim 1, wherein the light source is in direct contact with the [lateral plane] *first surface* of the *second supporting portion of the* light source supporter.

8. The backlight assembly of claim 1, further comprising a reflective sheet interposed between the light guide plate and the [bottom plane] *supporting surface of the first supporting portion* of the light source supporter.

9. A backlight assembly comprising:

a light source which emits light;

a light guide plate [disposed adjacent to the light source and] which receives the light emitted from the light source;

a light source supporter disposed under the light source and the light guide plate; an optical sheet disposed on the light guide plate;

a first receiving unit accommodating the light guide plate and the light source, and a middle frame which is coupled to the first receiving unit, *wherein a portion of the middle frame is disposed between the light source and a lateral portion of the first receiving unit*, wherein the light source supporter comprises a [bottom plane] *first supporting portion* and a [lateral plane] *second supporting portion* which is extended vertically from the [bottom plane] *first supporting portion* and integrated with the [bottom plane] *first supporting portion*, *the first supporting portion comprising a supporting surface, the second supporting portion comprising a first surface and a second surface opposing the first surface,* and wherein at least a portion of the middle frame is in direct contact with more than a substantial portion of [a major surface plane defining the lateral plane] *the second surface of the second supporting portion* of the light source supporter.

10. The backlight assembly of claim 9, wherein the light source is in direct contact with [both the bottom plane and the lateral plane of] *the first surface of the second supporting portion of* the light source supporter.

11. The backlight assembly of claim 9, wherein the middle frame comprises a U-shaped portion, and at least a portion of the U-shaped portion of the middle frame is disposed in the inner space.

12. The backlight assembly of claim 11, wherein the middle frame further comprises a bent portion connected to the U-shaped portion and disposed on an optical sheet disposed on the light source and the light guide plate.

13. The backlight assembly of claim 9, wherein the light source supporter includes a metal plate.

14. The backlight assembly of claim 9, wherein a hole is formed in a bottom surface of the first receiving unit, and the light source supporter further comprises a protrusion disposed in the hole.

15. A liquid crystal display, comprising:

a liquid crystal panel which displays an image; *and* a backlight assembly comprising:

a light source disposed adjacent to an edge portion of the liquid crystal panel, *wherein the light source comprises a printed circuit board and a light emitting diode*;

a light guide plate [disposed adjacent to the light source and] which emits light to the liquid crystal panel;

an optical sheet disposed between the light guide plate and the liquid crystal panel;

a first receiving unit including a bottom [plane] *portion* and a lateral [plane] *portion* which is extended vertically from the bottom [plane] *portion* and integrated with the bottom [plane] *portion* and accommodating the light source, the light guide plate and the optical sheet; [and]

a light source supporter which supports the light source and the light guide plate, the light source supporter comprising a [bottom plane and a lateral plane] *first supporting portion and a second supporting portion* which is extended vertically from the [bottom plane] *first supporting portion* and integrated with the [bottom plane] *first supporting portion, the first supporting portion comprising a supporting surface, the second supporting portion comprising a first surface and a second surface opposing the first surface*; and a second receiving unit covering at least a portion of the edge portion of the liquid crystal panel and the side wall of the first receiving unit, wherein the light source and the light guide plate are disposed on the [first region of the bottom plane] *supporting surface of the first supporting portion* of the light source supporter, [and]

wherein the [lateral plane of] *second surface of the second supporting portion of* the light source supporter is in direct contact with the lateral [plane] *portion* of the first receiving unit,

*wherein the first supporting portion of the light source supporter is disposed directly on the bottom portion of the first receiving unit, and*

*wherein a height of the second supporting portion of the light source supporter is less than or equal to a height of the lateral portion of the first receiving unit*.

16. The liquid crystal display of claim 15, wherein the light source is in direct contact with the [lateral plane] *first surface of the second supporting portion* of the light source supporter.

17. The liquid crystal display of claim 15, further comprising a reflective sheet interposed between the light guide plate and the [bottom plane] *supporting surface of the first supporting portion* of the light source supporter.

18. The liquid crystal display of claim 15, further comprising a middle frame, which is coupled to the first receiving unit, wherein at least a portion of the middle frame is in direct contact with the light source supporter.

19. The liquid crystal display of claim 15, wherein the light source supporter includes metallic material.

* * * * *